(12) United States Patent
Yamada

(10) Patent No.: US 9,312,018 B1
(45) Date of Patent: Apr. 12, 2016

(54) SENSING WITH BOOST

(71) Applicant: Intel Corporation, Santa Clara, CA (US)

(72) Inventor: Shigekazu Yamada, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/494,678

(22) Filed: Sep. 24, 2014

(51) Int. Cl.
*G11C 16/00* (2006.01)
*G11C 16/26* (2006.01)
*G11C 16/30* (2006.01)

(52) U.S. Cl.
CPC .............. *G11C 16/26* (2013.01); *G11C 16/30* (2013.01)

(58) Field of Classification Search
USPC ............................ 365/185.17, 185.21, 185.25
See application file for complete search history.

(56) References Cited

U.S. PATENT DOCUMENTS

| | | |
|---|---|---|
| 2002/0085428 A1 | 7/2002 | Kang et al. |
| 2005/0078524 A1 | 4/2005 | Hosono et al. |
| 2005/0105344 A1 | 5/2005 | Chung |
| 2007/0177422 A1 | 8/2007 | McAdams |
| 2008/0225618 A1* | 9/2008 | Hosono ............... G11C 11/5621 365/207 |
| 2010/0074032 A1 | 3/2010 | Childs et al. |
| 2014/0241070 A1* | 8/2014 | Wang ....................... G11C 7/12 365/189.02 |

OTHER PUBLICATIONS

International Search Report and Written Opinion received for PCT Application No. PCT/US2015/047728, mailed Dec. 10, 2015, 11 pages.

* cited by examiner

*Primary Examiner* — Hoai V Ho
(74) *Attorney, Agent, or Firm* — Grossman, Tucker, Perreault & Pfleger, PLLC

(57) ABSTRACT

The present disclosure relates to sensing with boost. An apparatus includes boost logic. Boost logic includes a boost source and a plurality of boost interfaces coupled to the boost source. The boost source is configured to provide a boost clamp voltage to each of the plurality of boost interfaces. Each of the plurality of boost interfaces includes a respective buffer configured to buffer the boost source from a respective load. Each boost interface is configured to provide a boost voltage to the respective load. The boost voltage configured to increase a sense window. The boost voltage related to the boost clamp voltage.

25 Claims, 10 Drawing Sheets

SENSING WITH BOOST

FIELD

The present disclosure relates to sensing, in particular, to sensing with boost.

BACKGROUND

Memory, e.g., computer memory, includes volatile memory and non-volatile memory (NVM). Volatile memory retains stored information while powered and loses the stored information when power is removed. NVM retains stored information after power is removed. Volatile memory includes, for example, dynamic random access memory (dynamic RAM) and static RAM. NVM includes, for example, read-only memory (ROM) and some types of RAM. NVM technology may include, but is not limited to, phase change memory (PCM), a three dimensional cross point memory, resistive memory, nanowire memory, ferro-electric transistor random access memory (FeTRAM), flash memory such as NAND or NOR, magnetoresistive random access memory (MRAM), memory that incorporates memristor technology, spin transfer torque (STT)-MRAM, etc.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure describes an apparatus, system and method configured to increase a sensing window related to accessing a memory cell. The apparatus includes boost logic configured to generate, maintain, adjust and/or discharge a boost voltage. The boost voltage may then be utilized to increase the sensing window. Boost logic includes a boost source and a plurality of boost interfaces. Boost source is configured to generate a boost clamp voltage and to provide the boost clamp voltage to the boost interfaces. Each boost interface is configured to provide a boost voltage related to the boost clamp voltage to a respective load, e.g., sensing element, in each sense amplifier of a memory array. For example, the sensing element may be a sense capacitor. The boost interfaces are configured to buffer the boost source from the load to reduce and/or prevent dependence of boost voltage on load. For example, in a memory read operation, a plurality of memory cells may be read in parallel. Sense capacitors may be configured to provide sensing currents to target memory cells. Depending on memory cell state, more or less current may be drawn from the sense capacitors. Thus, a load may depend on memory cell state. Buffering is configured to prevent the boost clamp voltage from being pulled down when load current is relatively high.

Boost logic may further include boost reset logic configured to drain stored charge related to the boost voltage. In some embodiments, boost logic may further include boost discharge logic configured to reduce the boost voltage from a first voltage Vboost1 to a second voltage Vboost2. Boost logic including boost reset logic may be utilized for sensing single level memory cells, as described herein. Boost logic including boost reset logic and boost discharge logic may be utilized for sensing multi-level memory cells, as described herein.

Figure 1:
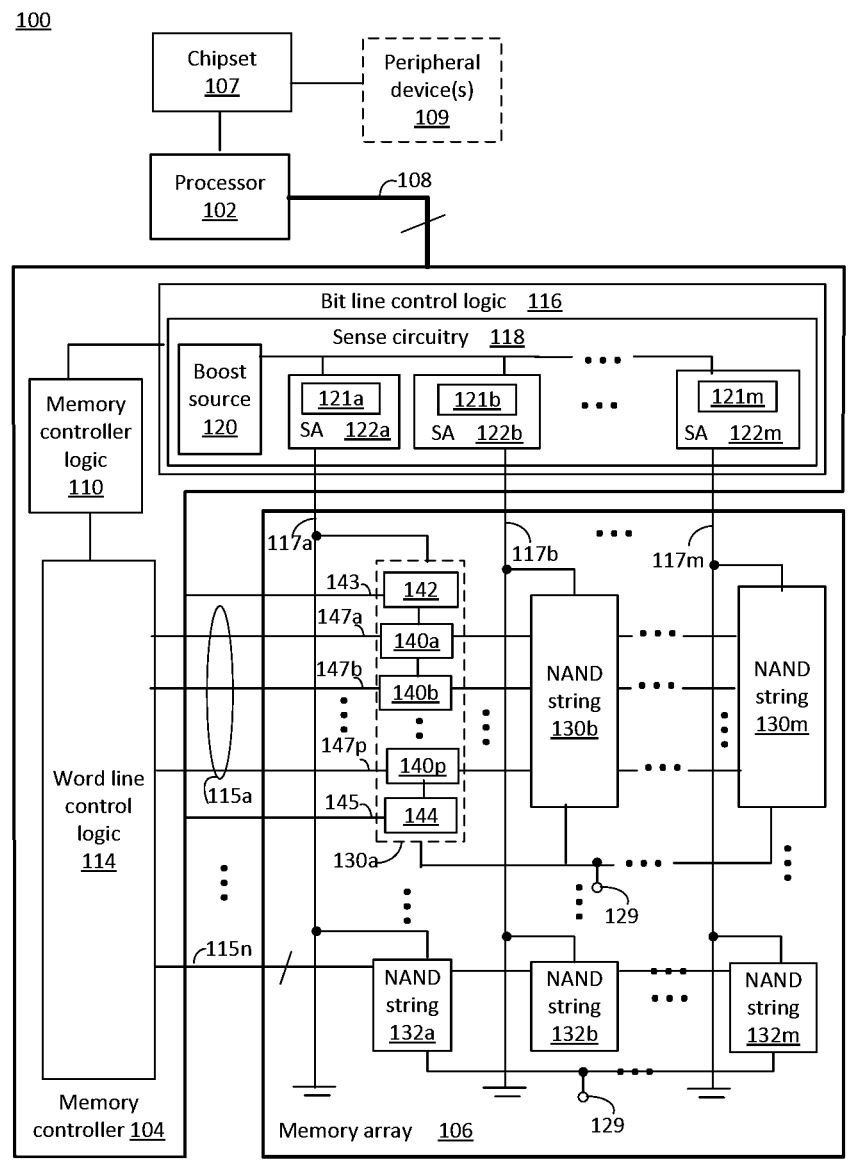
FIG. 1 illustrates a system block diagram consistent with several embodiments of the present disclosure.

FIG. 1 illustrates a system block diagram 100 consistent with several embodiments of the present disclosure. System 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone; a personal digital assistant (PDA); etc.

System 100 includes a processor 102, a memory controller 104, a memory array 106 and a chipset 107. In some embodiments, system 100 may include one or more peripheral device(s) 109 coupled to system 100 by chipset 107. Peripheral device(s) 109 may include, for example, user interface device(s) including a display, a touch-screen display, printer, keypad, keyboard, etc., communication logic, wired and/or wireless, storage device(s) including hard disk drives, solid-state drives, removable storage media, etc.

The processor 102 is coupled to the memory controller 104 by bus 108. Processor 102 may provide read and/or write requests that include memory address(es) and/or associated data to memory controller 104 and may receive read data from memory controller 104. For example, processor 102 may receive one or more memory access request(s) from one or more of the peripheral devices 109 and may provide corresponding read and/or write requests to memory controller 104. Memory controller 104 is configured to perform memory access operations, e.g., reading and/or writing one or more target memory cell(s) and to generate, maintain, adjust and/or discharge a boost voltage configured to increase a sensing window for each memory cell. It should be noted that system 100 is simplified for ease of illustration and description.

Memory array 106 includes a plurality of groups of word lines (WLs) 115a, ..., 115n, a plurality of bit lines (BLs) 117a, 117b, ..., 117m and a plurality of memory cell strings 130a, 130b, ..., 130m, ..., 132a, 132b, ..., 132m. Memory array 106 may be coupled to memory controller 104 by one or more of the groups of WL(s) 115a, ..., 115n and/or one or more of the BL(s) 117a, 117b, ..., 117m. Each of a plurality of memory cell strings, e.g., memory cell string(s) 130a, ..., 132a, may be controllably coupled to the memory controller 104 via a BL, e.g., BL 117a. For example, memory array 106 may correspond to NAND flash memory.

Each memory cell string, e.g., memory cell string 130a, includes a plurality of memory cells, e.g., memory cells 140a, ..., 140p, coupled in series. Memory cell string 130a includes a plurality of selectors 142, 144. Each selector 142, 144 may be coupled to memory controller 104 by a respective selector line 143, 145. Each selector line 143, 145 is configured to carry a control signal to a respective selector 142, 144. Selector 142 is configured to controllably couple memory cell string 130a to an associated BL, e.g., BL 117a, and selector 144 is configured to controllably couple the memory cell string 130a to a common 129, e.g., a substrate. Selectors 142, 144 may include ovonic threshold switches, diodes, bipolar junction transistors, field-effect transistors, etc.

For example, a first memory cell 140a in the string is coupled to the first selector 142. The first selector 142 is configured to couple the string 130a to a bit line ("BL"), e.g., BL 117a. A last memory cell 140p in the string is coupled to the second selector 144 configured to couple the string 130a to a common 129 and/or substrate. For example, the memory cells 140a, 140b, ..., 140p may correspond to metal oxide semiconductor field effect transistors (MOSFETs). A respective control gate of each memory cell 140a, 140b, ..., 140p may then be controllably coupled to a respective word line ("WL"), e.g., WL 147a, 147b, ..., 147p.

Continuing with this example, a target memory cell, e.g., memory cell 140a, may be selected by applying a WL select voltage (e.g., Vread) to an associated WL, e.g., WL 147a, coupled to the target memory cell 140a, applying a BL select voltage to an associated BL, e.g., BL 117a, coupling the associated BL 117a to the string 130a via selector 142 and the string 130a to the common 129 via selector 144. The other memory cells 140b, ..., 140p in the string 130a may be configured to pass BL current by application of an appropriate bias voltage (e.g., Vpass) to each other memory cell 140b, ..., 140p via a respective WL 147b, ..., 147p. The WL select voltage may be applied to memory cells in each of memory strings 130b, ..., 130m and BL select voltage may be applied to BLs 117b, ..., 117m. Thus, a plurality of memory cells may be accessed in parallel.

For example, for MOSFET memory cells, a drain of the first memory cell 140a may be coupled to the first selector 142, a source of the first memory cell 140a may be coupled to a drain of the second memory cell 140b, a source of the second memory cell 140b may be coupled to drain of a third memory cell and so on until a source of the last memory cell 140p may be coupled to selector 144. A control gate of the first memory cell 140a may be coupled to the first WL 147a. Each control gate of the other memory cells 140b, ..., 140p may be coupled to a respective WL 147b, ..., 147p. In a read operation for example, the WL select voltage applied to the first WL 147a may correspond to Vread. A voltage (Vpass) configured to cause the other memory cells 140b, ..., 140p to conduct (i.e., bias memory cells 140b, ..., 140p to turn on) may be applied to the other WLs 147b, ..., 147n. The read voltage, Vread, is configured be greater than a first threshold voltage associated with a first state of the target memory cell and less than a second threshold voltage associated with a second state of the target memory cell. The first threshold voltage is less than the second threshold voltage. Vpass is configured to be greater than the second threshold voltage. Thus, if current flows in the string 130a in response to Vread, the first state may be detected and if current does not flow, the second state may be detected. The current flow may be related to the threshold voltage of a target memory cell. A plurality of memory cells may have a distribution of threshold voltages associated with each memory cell state. For an SLC memory cell, the first state typically corresponds to a logic one and the second state typically corresponds to a logic zero.

Each memory cell 140a, 140b, ..., 140p is configured to store information. In an embodiment, each memory cell may be configured to store one bit of binary data. In this embodiment, the memory cell may be understood as a single level cell (SLC). In another embodiment, each memory cell may be configured to store a plurality of bits of binary data. In this embodiment, the memory cell may be understood as a multi-level cell (MLC). One or more memory cells 140a, 140b, ..., 140p may be written to (i.e., programmed) and/or read from. In NAND flash memory, for example, a memory cell threshold voltage is related to a state of the memory cell, i.e., a value stored in the memory cell. A sense current may then be utilized to detect the state of the memory cell.

Memory controller 104 includes memory controller logic 110, WL control logic 114 and BL control logic 116. BL control logic 116 includes sense circuitry 118. Sense circuitry 118 may include boost source 120 and includes a plurality of sense amplifiers 122a, 122b, ..., 122m. Memory controller logic 110 is configured to perform operations associated with memory controller 104. For example, memory controller logic 110 may manage communications with processor 102. Memory controller logic 110 may be configured to identify one or more target WLs and/or BLs associated with each received memory address. Memory controller logic 110 may be configured to manage operations of WL control logic 114 and BL control logic 116 based, at least in part, on the target WL and/or target BL identifiers (i.e., addresses).

WL control logic 114 is configured to receive target WL address(es) from memory controller logic 110 and to select one or more WLs for reading and/or writing operations. For example, WL control logic 114 may be configured to select a target WL by coupling a WL select bias voltage to the target WL. WL control logic 114 may be configured to deselect a WL by decoupling the target WL from the WL select bias voltage and/or by coupling a WL deselect bias voltage to the WL. For example, the WL select bias voltage may correspond to Vread and the WL deselect bias voltage may correspond to Vpass. WL control logic 114 may be coupled to the plurality of groups of WLs 115a, ..., 115n. BL control logic 116 is configured to receive target BL address(es) from memory controller logic 110 and to select one or more BLs for memory access operations, e.g., reading and/or writing. BL control logic 116 may be configured to select a target BL by coupling a BL select bias voltage to the target BL. BL control logic 116 may be configured to deselect a BL by decoupling the target BL from the BL select bias voltage and/or by coupling a BL deselect bias voltage to the BL. Memory controller logic 110 is configured to manage select, read and write operations of WL control logic 114 and BL control logic 116 and to receive sense data from sense circuitry 118.

In the embodiment depicted in FIG. 1, BL control logic 116 includes sense circuitry 118. In another embodiment, sense circuitry 118 may be included in WL control logic 114. In another embodiment, a portion of sense circuitry 118 may be included in BL control logic 116. Sense circuitry 118 is configured to detect (e.g., read) a state of one or more memory cells included in memory array 106. Sense circuitry 118 may be further configured to provide an output (e.g., data out) to, for example, memory logic controller 110.

Sense circuitry 118 includes boost source 120 and a plurality of sense amplifiers 122a, 122b, . . . , 122m. Each sense amplifier 122a, 122b, . . . , 122m includes a respective boost interface 121a, 121b, . . . , 121m. Boost source 120 and the plurality of boost interfaces 121a, 121b, . . . , 121m are included in boost logic, as described herein. During a memory cell read operation, for example, memory controller logic 110 and/or BL control logic 116 are configured to couple each memory cell string of a row of selected memory cell strings, e.g., memory cell strings 130a, 130b, . . . , 130m, to respective sense amplifiers, e.g., sense amplifiers 122a, 122b, . . . , 112m, via associated respective BLs, e.g., BLs 117a, 117b, . . . , 117m. The sense amplifiers 122a, 122b, . . . , 112m are each configured to detect a state of a selected memory cell in a respective memory cell string 130a, 130b, . . . , 130m.

A plurality of memory cells may have a respective distribution of threshold voltages for each state of the memory cells. The distributions are related to physical characteristics and charges on the memory cells. The distributions are configured to not overlap. Memory read voltages are configured to be between the distributions. For example, for an SLC memory cell, a negative threshold generally corresponds to a logic one and a positive threshold voltage generally corresponds to a logic zero. A WL select voltage may then correspond to zero volts. In order to increase a sense window for detecting a logic zero, boost logic including boost source 120 and boost interfaces 121a, 121b, . . . , 121m may be configured to provide boost voltage(s) to the sense amplifiers 122a, 122b, . . . 122m. In this manner, a stored zero may result in a relatively larger voltage change facilitating detection, as described herein. Increasing the sense window may be relatively more important when reading a MLC memory cell as compared to reading a SLC memory since distributions of threshold voltages may be relatively more narrow and relatively closer together for a MLC memory cell.

Typically, a plurality of memory cells are read in parallel, for example, a plurality of bits associated with one word and a plurality of words. For example, on the order of tens of thousands of memory cells may be accessed in parallel. If a relatively large number of the selected memory cells are storing a logic one (or a value that corresponds to a threshold voltage less than Vread), current may flow in each associated memory cell string. Such a current flow in a plurality of memory cells may pull down a conventional power source. Since a state of a memory cell may generally not be known prior to reading it, whether the conventional power source is pulled down by the read operation may also not be known. A conventional power source is configured to recover in a finite time period. Thus, a wait time may be implemented that corresponds to the recovery period for each read. If the read memory cells stored some number of zeros, the wait time may be unnecessary and thus including the wait time may result in a relatively slower read operation than might otherwise be possible.

In an embodiment, boost logic that includes boost source 120 and respective boost interface(s) 121a, 121b, . . . , 121m is configured to maintain a boost source output voltage at a target level (boost clamp voltage) independent of the state(s) of the read memory cells, as described in more detail below. In another embodiment, boost source 120 and boost interfaces 121a, 121b, . . . , 121m may be configured to provide a boost-down. Boost-down corresponds to a controlled decrease (i.e., discharge) in boost voltage level configured to facilitate reading MLC memory cell(s). Each of a plurality of boost voltages may correspond to a respective state of an MLC memory cell.

Figure 2:
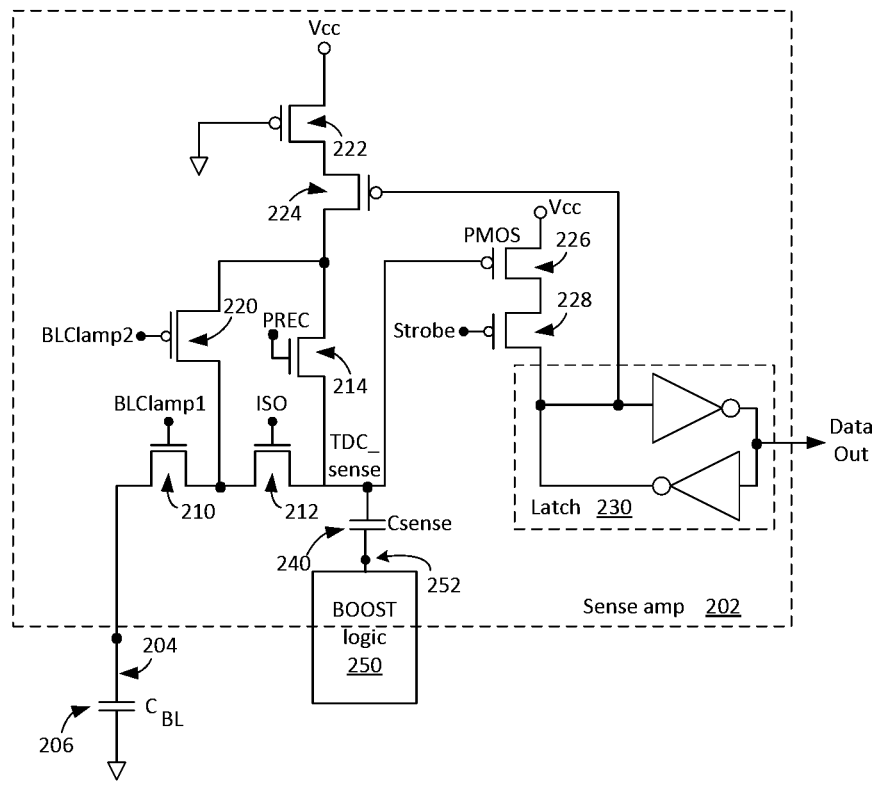
FIG. 2 illustrates an example sense amplifier with boost coupled to a bit line consistent with several embodiments of the present disclosure.
Figure 3A:
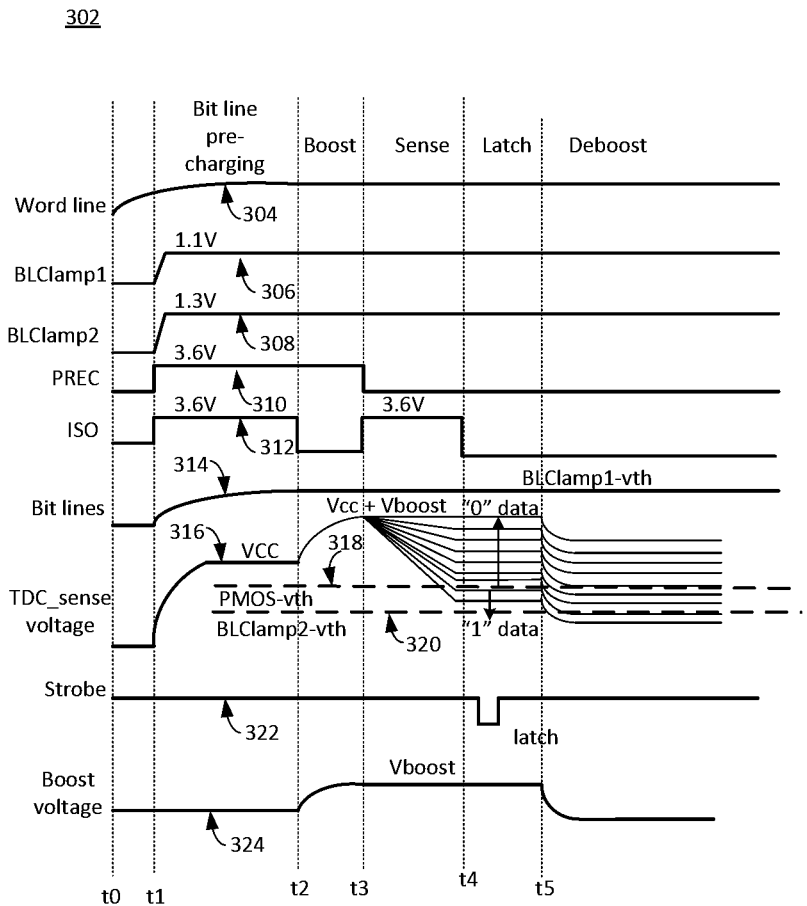
FIGS. 3A and 3B illustrate timing diagrams related to reading a single level memory cell (SLC) and a multi-level memory cell (MLC), respectively, consistent with several embodiments of the present disclosure.
Figure 3B:
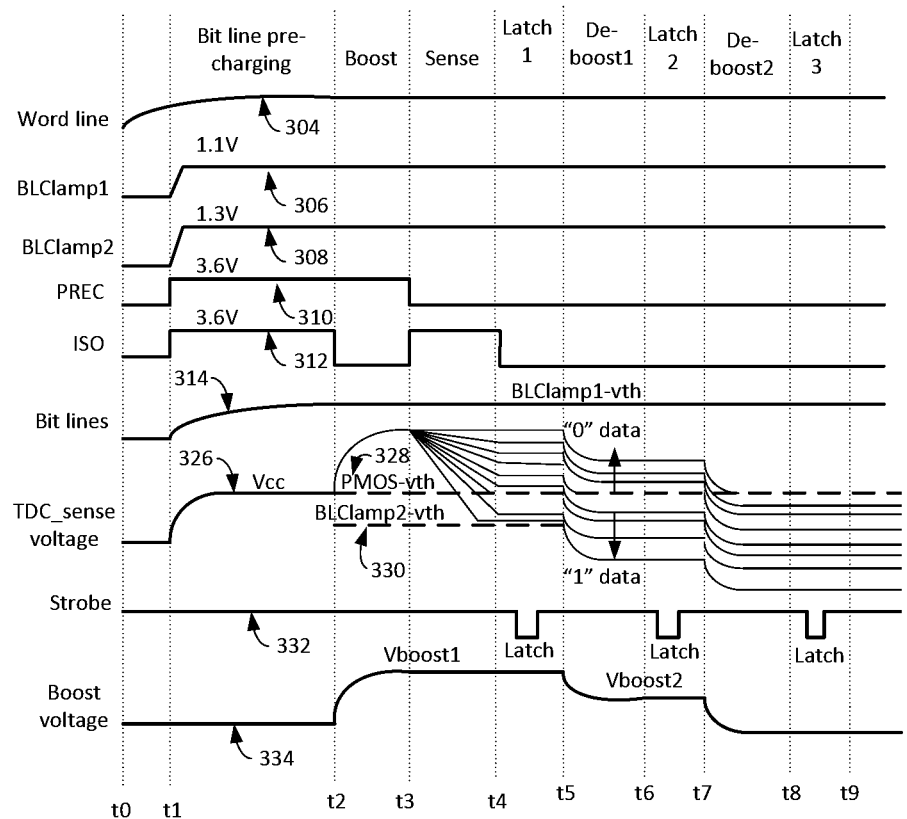

FIG. 2 illustrates an example sense amplifier 202 with boost logic 250. A portion of boost logic 250, e.g., a boost interface, may be included in sense amplifier 202 and a portion of boost logic 250, e.g., boost source 120, may be external to sense amplifier 202. Thus, one boost source may be coupled to a plurality of boost interfaces and associated sense amplifiers. The sense amplifier 202 is coupled to a BL 204. BL 204 parasitic capacitance is illustrated as capacitor 206 that has a capacitance value $C_{BL}$. It should be noted that sense amplifier 202 has been simplified for ease of description and ease of illustration. The operation of sense amplifier 202 with boost logic 250 may be best understood when viewed together with FIGS. 3A and 3B. FIG. 3A illustrates a timing diagram 302 related to accessing a SLC memory cell and FIG. 3B illustrates a timing diagram 352 related to accessing a MLC memory cell. For example, a memory cell access operation may include a read and/or a write operation.

Typically, the state of a NAND flash memory cell is detected using a charge integration technique. In other words, a threshold voltage of a NAND memory cell is related to a state of the memory cell (i.e., stored value) and current through the memory cell may be related to the threshold voltage. In charge integration, a change in voltage on a sense capacitor, detected over a sense interval is related to current flow during the interval and the capacitance. For example, during a precharge interval, one or more capacitances(s) may be coupled to a power source and charged to a target voltage. The capacitance(s) may include parasitic capacitance associated with a BL and/or a sense capacitor. During a sense interval, the power source may be decoupled from the capacitance(s) and the capacitances(s) may remain coupled to the memory string. At an end of a time period (e.g., sense interval), the voltage across the capacitance may be compared to a sense threshold voltage. If the voltage drops below the sense threshold voltage, then the state of the target memory cell may correspond to a logic one and/or a value that corresponds to a threshold voltage that is less than an applied Vread. If the voltage does not drop below the sense threshold voltage, then the state of the target memory cell may correspond to a logic zero and/or a value that corresponds to a threshold voltage that is greater than the applied Vread. For MLCs, a plurality of readings may be performed to determine the stored value.

For example, sense amplifier 202 includes a plurality of NMOS transistors 210, 212, 214, a plurality of PMOS transistors 220, 222, 224, 226, 228, a latch 230 and a sense capacitor 240. Transistor 210 is controlled by BLClamp1 and is coupled between BL 204 and transistor 212. Transistor 212 is controlled by ISO and is also coupled to node TDC_sense. Transistor 214 is controlled by PREC and is coupled to node TDC_sense and transistor 220. Transistor 220 is controlled by BLClamp2 and is coupled to transistors 210, 212 and 214. Transistor 222 is coupled to a supply voltage Vcc and transistor 224 and its control input is coupled to ground. Transistor 224 is coupled to transistors 214, 220 and its control input is coupled to latch 230. Transistor 226 is coupled to Vcc and transistor 228 and its control input is coupled to node TDC_sense. Transistor 226 corresponds to "PMOS" of PMOS-Vth illustrated by dotted lines 318 of FIG. 3A and 328 of FIG. 3B. Transistor 228 is coupled to latch 230 and its control input is coupled to Strobe. Latch 230 is configured to latch a voltage level related to TDC_sense voltage (i.e., voltage detected at node TDC_sense) and to provide a corresponding output as Data Out.

Capacitor 240 is a sense capacitor, has capacitance Csense and is coupled between node TDC_sense and boost logic 250. Csense may be selected to correspond to a target sense interval duration. In other words, a value of Csense may be related to a memory cell access time and may be selected to maximize memory throughput. $C_{BL}$ is related to physical characteristics (e.g., length, cross section, etc.) of BL 204. For example, Csense may be less than $C_{BL}$ and may thus provide a relatively shorter memory access time than $C_{BL}$ alone may provide.

Referring now to FIGS. 3A and 3B, at time t0 BLClamp1 306, BLClamp2 308, PREC 310, ISO 312, BL voltage 314, TDC_sense voltage 316, 326 and boost voltage 324, 334 may all be low and strobe 322, 332 may be high. BLClamp1 306 is configured to bias one or more BLs, e.g., BL 204. BLClamp2 308 is configured to provide a lower limit to BL 204 voltage (i.e., voltage across BL capacitance $C_{BL}$) At t0, a WL may be selected and WL voltage 304 may begin to charge up toward, for example, Vread. At time t1, a precharge time period begins, PREC 310 and ISO 312 switch from low to high (e.g., 3.6 V), BLClamp1 and BLClamp2 begin to transition from low to respective target voltages (e.g., 1.1V and 1.3V). In response, BL capacitance 206 and sense capacitor 240 begin to charge up. Sense capacitor 240 charges relatively faster compared to BL capacitance 206. At time t2, the precharge time period ends, BL capacitance 206 is charged to BLClamp1 minus the threshold voltage of transistor 210, sense capacitor 240 is charged to Vcc and ISO 312 switches low decoupling the sense capacitor 240 from BL 204 and BL capacitance 206. Also at time t2, boost logic 250 initiates boost and node voltage at boost local node 252 may begin to charge up. Boost 324, 334 corresponds to voltage(s) at boost local node 252. TDC_sense (i.e., voltage at node TDC_sense) is related to boost and begins to charge up from Vcc toward Vcc plus boost voltage Vboost 316 or Vcc plus boost voltage Vboost1 326, respectively.

At time t3, a sensing time period begins, ISO 312 again switches from low to high and couples BL 204 (and associated BL capacitance 206) to sense capacitor 240 and node TDC_sense. The voltage at TDC_sense may begin to decrease. A rate of decrease is related to Csense and a state of the target memory cell(s). For example, current flow through a selected memory cell string is related to applied bias voltage, e.g., Vread, and a threshold voltage of the selected memory cell. For example, a change in voltage over a time interval may be related as $\Delta V=(I/C)*\Delta T$, where $\Delta V$ is the change in voltage at TDC_sense node, $\Delta T$ is the time interval, I is detected current and C corresponds to a sense capacitance. At time t4, ISO 312 switches low, decoupling node TDC_sense from BL 204 and ending the sense interval. TDC_sense voltage greater than PMOS-Vth (e.g., the threshold voltage of PMOS 226) 318 may then correspond to "0" data and TDC_sense voltage less than PMOS-Vth may then correspond to "1" data.

During a time interval between t4 and t5, Strobe 322, 332 switches low, dwells low then switches high. "0" data or "1" data may then be captured by latch 230 and may then be provided as output Data Out. At time t5, the boost voltage may be decreased ("Deboost", Deboost1), i.e., controllably discharged, as described herein, and TDC_sense voltage 316, 326 may similarly decrease. A memory cell access operation may then end for timing diagram 302 and associated SLC memory cell. For timing diagram 352 and associated MLC, Strobe 332 may be configured to latch data for a second boost voltage Vboost2 between time t6 and t7. The boost voltage may then be decreased ("Deboost2") again at time t7 and data may be latched between times t8 and t9. The memory access operation may then end.

Thus, a sense window may be increased by including one or more boost voltage(s). Boost logic 250 is configured to generate, maintain, adjust and/or discharge one or more boost voltages, as described herein.

Figure 4:
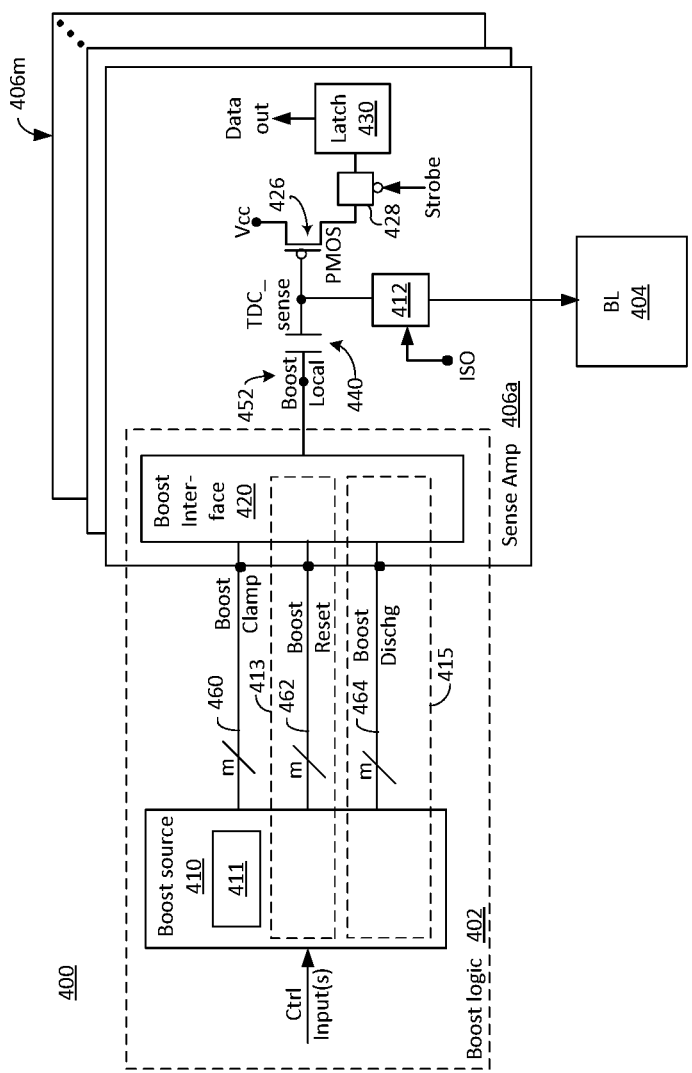
FIG. 4 illustrates example sense circuitry including boost logic, consistent with various embodiments of the present disclosure.

FIG. 4 illustrates example sense circuitry 400, consistent with various embodiments of the present disclosure. Sense circuitry 400 is an example of sense circuitry 118 of FIG. 1. Sense circuitry 400 includes boost logic 402 and a plurality of sense amplifiers 406a, . . . , 406m. Boost logic 402 includes a boost source 410 and a plurality of boost interfaces. Each sense amplifier, e.g. sense amplifier 406a, includes a respective boost interface, e.g., boost interface 420. In other words, boost logic 402 includes a boost source 410 that may be shared by a plurality of sense amplifiers 406a, . . . , 406m and boost logic 402 further includes the plurality of boost interfaces.

Boost logic 402 includes boost reset logic 413 and may include boost discharge logic 415. Boost source 410 includes a boost clamp power source 411. At least a portion of boost reset logic 413 may be included in boost source 410 and/or boost interface 420. At least a portion of boost discharge logic 415 may be included in boost source 410 and/or boost interface 420. In some embodiments, element(s) of boost reset logic 413 may be included in and/or operated along with element(s) of boot discharge logic 415 to perform boost discharge operations. In some embodiments, element(s) of boot discharge logic 415 may be included in and/or operated along with element(s) of boost reset logic 413 to perform boost reset operations.

Each sense amplifier, e.g., sense amplifier 406a, includes a sense capacitor 440, switch 412, transistors 426, 428 and latch 430. Switch 412, PMOS 426, switch 428, latch 430, sense capacitor 440 and node 452 correspond to elements 212, 226, 228, 230, 240 and 252 of FIG. 2, respectively. Sense amplifier 406a is simplified to highlight boost logic 402. Operation of sense amplifier 406a and boost logic 402 correspond to operation of sense amplifier 202 with boost logic 250 of FIG. 2. Sense capacitor 440 has capacitance Csense and is coupled between nodes boost local and TDC_sense. Switch 412 (e.g., an NMOS transistor) is configured to controllably couple BL 404 to node TDC_sense and is controlled by ISO. PMOS 426 is coupled to strobe transistor 428. Strobe transistor 428 is configured to controllably couple transistor 426 to latch 430 and is controlled by Strobe.

Boost source 410 is configured to provide one or more boost clamp voltage(s) to boost interface 420. Boost clamp power supply 411 is configured to supply the boost clamp voltage(s). Boost source 410 is configured to receive one or more control signals from, for example, memory controller logic 110 and/or BL control logic 116 of FIG. 1. Control signal(s) may include, for example, one or more reference voltage(s), one or more reset signal(s) and/or one or more discharge signal(s). Boost source 410 is coupled to each respective boost interface, e.g., boost interface 420, by a first path 460 and a second path 462. The first path 460 is configured to carry a boost clamp voltage from boost clamp power source 411 to each boost interface. The second path 462 is configured to carry a boost reset signal from boost source 410 to each boost interface, e.g., boost interface 420. For example, a parallel combination of sense amplifiers 406a, . . . , 406m may be coupled to boost source 410 by the first path 460 and the second path 462. Thus, the first path 460 and the second path 462 may each include a plurality of conductive paths. In some embodiments, boost source 410 may be coupled to each respective boost interface by a third path 464. The third path 464 is configured to carry a boost discharge signal from boost source 410 to each boost interface, e.g., boost interface 420.

Boost interface 420 is configured to receive a boost clamp voltage from boost source 410 and to provide one or more boost voltage(s) related to the received boost clamp voltage to the boost local node 452. Boost interface 420 is configured to maintain the boost voltage(s) independent of load, i.e., independent of a number of logic ones stored by coupled memory cells. Boost interface 420 may thus include a buffer. The buffer is configured to have a relatively high input impedance and a relatively small output impedance. For example, boost interface may include a source follower. An input to the source follower may be coupled to boost source 410, e.g., boost clamp power source 411, and an output of the source follower may be coupled to a load, e.g., sense capacitor 440. Thus, boost clamp power source 411 may be buffered from a plurality of loads by each boost interface of a plurality of boost interfaces.

Boost source 410 is further configured to provide a boost reset signal to boost interface 420 configured to cause boost interface 420 to couple boost local node 452 to, for example, ground. Coupling boost local node 452 to ground is configured to reset a boost voltage. In other words, coupling boost local node 452 to ground may be configured to discharge sense capacitor 440 and/or BL 404. For example, boost logic 402 may include boost clamp power supply 411 and boost reset logic 413 configured to provide boost and/or reset related to accessing SLC memory cells. In an embodiment, boost logic 402 may be configured to adjust boost voltages to voltage levels between a maximum boost voltage and a boost reset voltage (e.g., zero volts). For example, boost logic 402 may include boost discharge logic 415 configured to controllably discharge at least a portion of a boost voltage to reduce the applied boost voltage. For example, boost logic 402 may be configured to reduce a boost voltage from a first boost voltage to a second boost voltage. Boost logic 402 that includes boost discharge logic 415 may be configured to provide boost voltage(s) for accessing MLC memory cells.

Thus, a boost source may be configured to supply a boost clamp voltage to a plurality of boost interfaces and associated sense amplifiers. The boost interfaces may be configured to buffer the boost clamp power source and to provide boost voltage(s) to each of a plurality of sense amplifiers. The supplied boost voltages may be maintained, independent of state(s) of read memory cells. In other words, boost interfaces (e.g., buffers) may prevent current flow related to memory cell state from pulling down the boost clamp power source 411.

Figure 5:
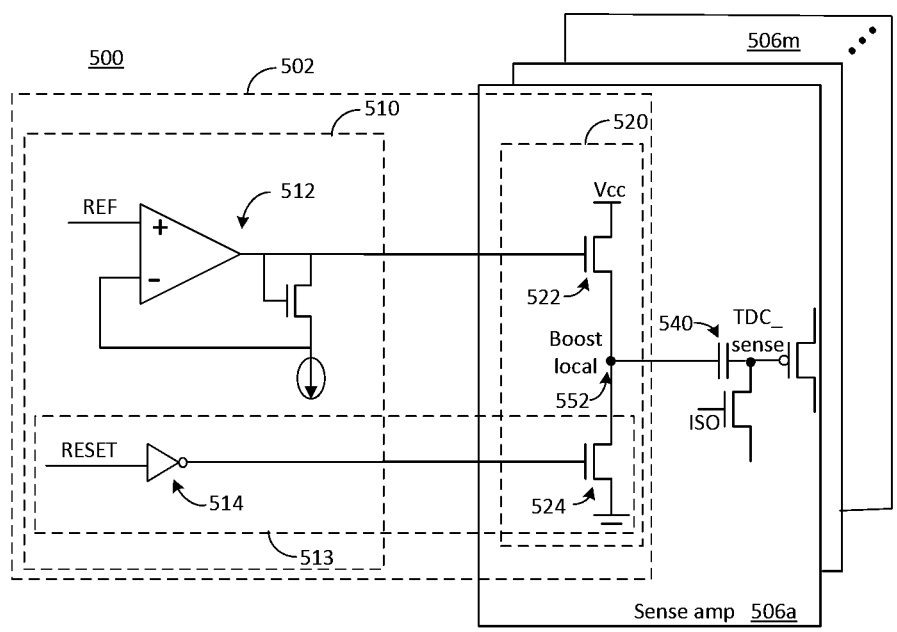
FIG. 5 illustrates one example of the sense circuitry including boost logic of FIG. 4 related to SLC memory cells.

FIG. 5 illustrates one example 500 of the sense circuitry 400 of FIG. 4 related to SLC memory cells. Sense circuitry 500 includes boost logic 502 configured to boost a sense voltage utilized for accessing SLC memory cells and to maintain the boosted sense voltage independent of the states of the accessed memory cells. Example boost logic 502 includes a boost source 510 and a plurality of boost interfaces, e.g., boost interface 520. Each boost interface is includes in a respective sense amplifier 506a, . . . , 506m. Boost logic 502 includes boost reset logic 513. Boost source 510 includes a boost clamp power source 512 and an inverter 514. Inverter 514 is included in boost reset logic 513. Boost clamp power source 512 is configured to receive a reference voltage REF and to provide boost clamp voltage output related to REF. For example, REF may be received from memory controller logic 110 and/or BL control logic 116 of FIG. 1. Inverter 514 is configured to receive a reset signal, RESET, and to provide a control signal to boost interface 520 in response. Boost interface 520 may be configured to discharge a sense capacitor in response, as described herein.

The boost interface 520 includes a buffer 522. An input to buffer 522 may be coupled to an output of boost clamp power source 512 and output of buffer 522 is coupled to boost local node 552. A sense capacitor 540 may be coupled to node 552, as described herein. For example, buffer 522 may include a buffer transistor configured as a voltage follower, e.g., a MOSFET configured as a source follower. A source follower configuration typically has a relatively high input impedance and a relatively low output impedance. Buffer 522 is configured to facilitate maintaining a boost voltage independent of load, e.g., when a number of associated memory cells are storing logic ones. A wait time for boost voltage recovery may thus be avoided. The boost interface 520 further includes a boost reset transistor 524 configured to couple boost local node 552 to ground. Boost reset transistor 524 is included in boost reset logic 513. Boost reset transistor 524 is configured to receive a control input via boost source 510 and inverter 514. Thus, a boost voltage at boost local node 552 may be controllably discharged.

Boost logic 502 may be used for supplying boost voltages to sense amplifiers configured to access SLC memory cells. Such memory cells may typically utilize a single boost voltage for memory access operations.

Figure 6A:
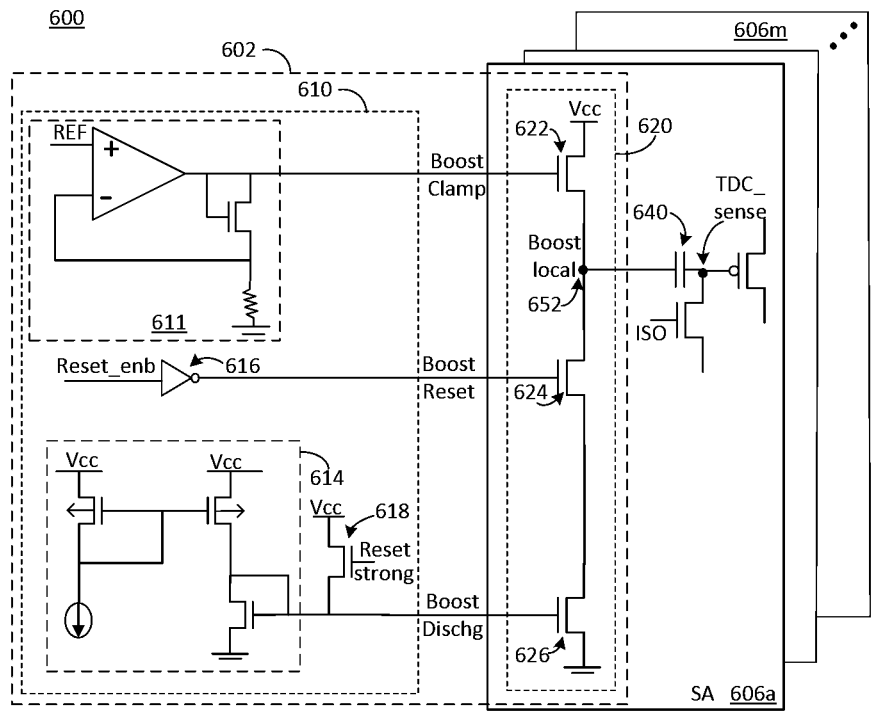
FIGS. 6A and 6B illustrate a first example of the sense circuitry including boost logic of FIG. 4 related to MLC memory cells and an associated timing diagram, respectively.
Figure 6B:
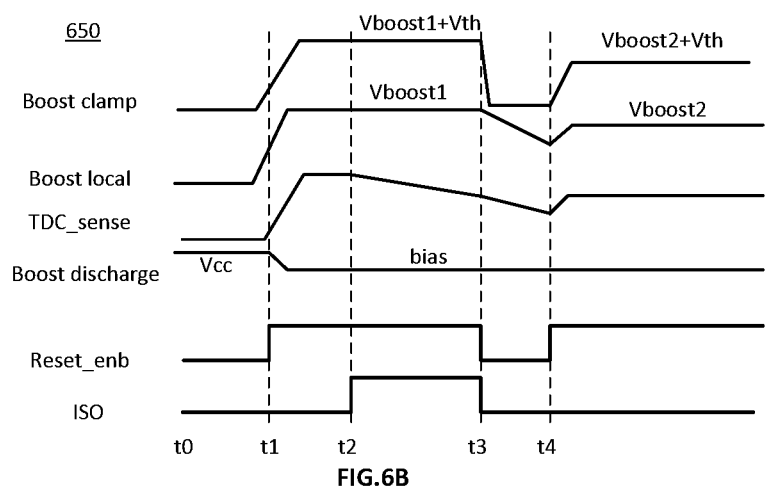

FIGS. 6A and 6B illustrate a first example 600 of the sense circuitry of FIG. 4 related to MLC memory cells and an associated timing diagram 650, respectively. First example sense circuitry 600 includes boost logic 602 and a plurality of sense amplifiers 606a, . . . , 606m. Boost logic 602 includes a boost source 610 and a plurality of boost interfaces, e.g., boost interface 620. Each boost interface is included in a respective sense amplifier 606a, . . . , 606m. Boost source 610 includes boost clamp power supply 611. Boost logic 602 includes boost reset logic and boost discharge logic, as described herein. At least a portion of boost reset logic and at least a portion of boost discharge logic is included in each of boost source 610 and boost interface 620.

The boost source 610 includes a current generator 614, a source reset transistor 618 and an inverter 616. Similar to example 500, the boost interface 620 includes a buffer, e.g., buffer transistor 622 and a boost reset transistor 624. Boost interface 620 further includes a boost discharge transistor 626. The boost clamp power source 611 is configured to receive a reference voltage control signal REF and to provide a boost clamp voltage related to REF to boost interface 620. Current generator 614 is configured to provide a boost discharge bias to boost discharge transistor 626 configured to control adjusting (e.g., reducing) a boost voltage. Boost voltage corresponds to the voltage at the boost local node 652. The boost voltage may be decreased to facilitate reading MLC memory cells. Each of a plurality of boost voltages may correspond to a respective state of an MLC memory cell.

A boost reset may be initiated in response to one or more reset control signal(s), e.g., Reset_enb and Reset_strong. The reset control signals may be received from, e.g., memory controller logic 110. For example, in response to the reset control signals, boost reset transistor 624 and boost discharge transistor 626 may be turned on thereby coupling the boost local node 652 to ground. A boost reset operation may be configured to couple boost local node 652 to ground, e.g., to discharge sense capacitor 640. Boost local node 652 may be coupled to ground by boost reset transistor 624 and boost discharge transistor 626. For example, boost reset transistor 624 may turn on when Reset_enb signal is low (and Boost reset is high). Boost discharge transistor 626 may turn on when Boost discharge signal is high. Boost discharge signal may be high when Reset strong signal is high thereby coupling the gate of boost discharge transistor 626 to Vcc via source reset transistor 618. Thus, in this example, boost reset logic includes inverter 616 and transistors 624, 626, 618.

Current generator 614 is configured to generate a relatively small current that may be utilized to control the bias of boost discharge transistor 626 and thereby control the boost discharge of a load (e.g., sense capacitor 640) coupled to boost local node 652. The relatively small current may be mirrored in boost interface 620 by boost discharge transistor 626. A boost discharge rate may thus be related to the mirrored current. A resulting voltage at boost local node 652, e.g., Vboost2, may be related to the mirrored current, a pulse duration associated with the Reset_enb signal and capacitance of sense capacitor 640. A boost discharge operation may be configured to discharge at least a portion of boost local voltage by controllably coupling boost local node 652 to ground. For example, boost reset transistor 624 may be turned on and source reset transistor 618 may be turned off. Current generator 614 may then be configured to bias boost discharge transistor 626 to control the discharge. Thus, in this example, boost discharge logic includes inverter 616, boost reset transistor 624, boost discharge transistor 626 and current generator 614.

Referring to FIG. 6B, during operation, at time t1, Reset_enb transitions from low to high turning off boost reset transistor 624. Boost clamp voltage ramps up to a voltage that corresponds to Vboost1 plus a threshold voltage Vth of buffer transistor 622 and boost local voltage (i.e., voltage at boost local node 652) charges up to Vboost1. Also, at time t1, Boost discharge control signal transitions from Vcc to a bias voltage related to the current from current generator 614. In other words, source reset transistor 618 turns off at time t1. A sensing interval corresponds to time t2 to t3. At time t3, Reset_enb transitions from high to low, turning on boost reset transistor 624, coupling boost discharge transistor 626 to boost local node 652. At time t4, Reset_enb transitions from low to high, turning off transistor 624, decoupling transistor 626 from boost local node 652. During the time interval from t3 to t4, voltage at boost local node 652 ramps down. A final value of boost local voltage at time t4 is related to a duration of the interval between t3 and t4 and the bias of the boost discharge transistor 626.

Thus, a boost voltage may be supplied to a plurality of sense amplifiers that include buffer 622 and pull down of the boost clamp power supply by memory read currents may be avoided. Boost voltage may be controllably discharged through one additional transistor (e.g., boost discharge transistor 626) per sense amplifier. An amount of discharge is related to an amount of current (i.e., related bias) of a boost discharge current source and a duration of the discharge time interval.

Figure 7A:
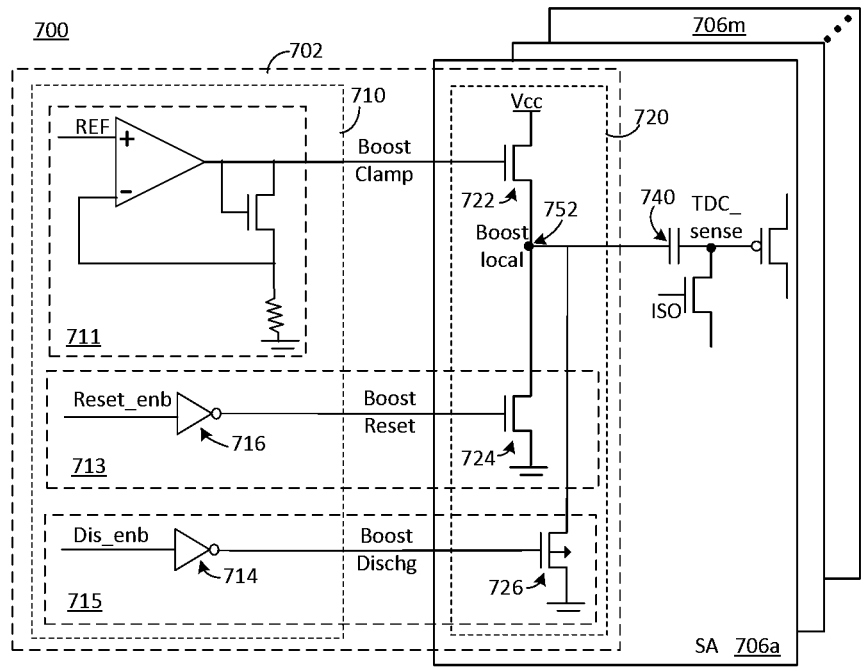
FIGS. 7A and 7B illustrate a second example of the sense circuitry including boost logic of FIG. 4 related to MLC memory cells and an associated timing diagram, respectively.
Figure 7B:
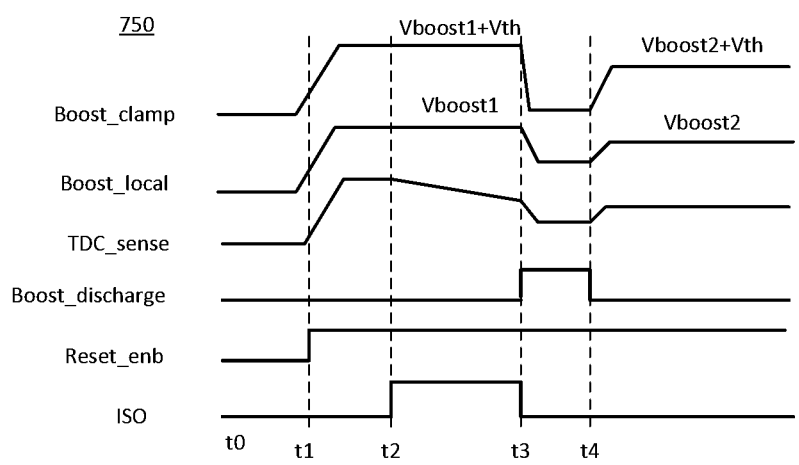

FIGS. 7A and 7B illustrate a second example 700 of the sense circuitry of FIG. 4 related to MLC memory cells and an associated timing diagram 750, respectively. Second example sense circuitry 700 includes boost logic 702 and a plurality of sense amplifiers 706a, . . . , 706m. Boost logic 702 includes a boost source 710 and a plurality of boost interfaces, e.g., boost interface 720. Each boost interface is included in a respective sense amplifier 706a, . . . , 706m. The boost source 710 includes a boost clamp power supply, e.g., boost voltage source 711. Boost logic 702 includes boost reset logic 713 and boost discharge logic 715. At least a portion of boost reset logic 713 and at least a portion of boost discharge logic 715 may be included in each of boost source 710 and boost interface 720. Boost discharge logic 715 includes a discharge enable inverter 714 and boost reset logic 713 includes a reset enable inverter 716. Discharge enable inverter 714 and reset enable inverter 716 are configured to receive respective control signals (Reset_enb, Dis_enb) from, e.g., memory controller logic 110 and/or BL control logic 116 of FIG. 1.

Similar to boost interface 620, the boost interface 720 includes a buffer, e.g., buffer transistor 722, and a boost reset transistor 724. An input of buffer transistor 722 is coupled to boost clamp power supply 711 and an output of buffer transistor 722 is coupled to boost local node 752 and thereby sense capacitor 740. An input of the boost reset transistor 724 is coupled to boost local node 752. The boost reset transistor 724 is included in boost reset logic 713. The boost interface 720 further includes a boost discharge transistor 726 coupled to boost local node 752. Boost discharge transistor 726 is included in boost discharge logic 715. Unlike the first example 600, boost discharge transistor 726 is a PMOS transistor and is coupled to the boost local node 752 without going through the boost reset transistor 724. In this example 700, boost discharge transistor 726 is configured to adjust boost local voltage without turning on boost reset transistor 724. Thus, boost discharge transistor 726 is configured to discharge boost local node 752 to a threshold voltage of boost discharge transistor 726. Boost clamp power supply 711 may then adjust a boost clamp voltage to a target value plus a threshold voltage, e.g., Vboost2 plus Vth.

Turning to FIG. 7B, during operation, at time t1, Reset_enb control signal transitions from low to high turning off boost reset transistor 724. Boost clamp supply voltage ramps up to a voltage that corresponds to Vboost1 plus a threshold voltage Vth of buffer transistor 722 and boost local node charges up to Vboost1. A time interval between t2 and t3 is a sensing interval. At time t3, Boost_discharge control signal transitions from low to high (e.g., in response to Dis_enb transitioning from high to low), turning on boost discharge transistor 726, coupling boost local node 752 to Vth of transistor 726. Boost discharge control signal corresponds to an output of inverter 714 and is, thus, Dis_enb control signal inverted. At time t4, Boost discharge control signal transitions from high to low, turning off boost discharge transistor 726. During the time interval from t3 to t4, boost local voltage ramps down relatively more quickly than the first embodiment 600. A final value of boost local voltage at time t4 is related to the threshold voltage of boost discharge transistor 726. If Vboost2 (i.e., target boost voltage) is greater than the threshold voltage of boost discharge transistor 726, then the rate of change of boost local voltage from Vboost1 to Vboost2 may be relatively fast.

Thus, in this second embodiment, a boost clamp voltage may be supplied to a plurality of sense amplifiers that each include buffer 722 and a boost voltage level may be maintained independent of memory access currents associated with sensing memory cell states. Boost voltage may be controllably discharged through an additional PMOS transistor (e.g., boost discharge transistor 726) down to the threshold voltage of the PMOS transistor (e.g., 0.8 to 0.9 volts).

Figure 8A:
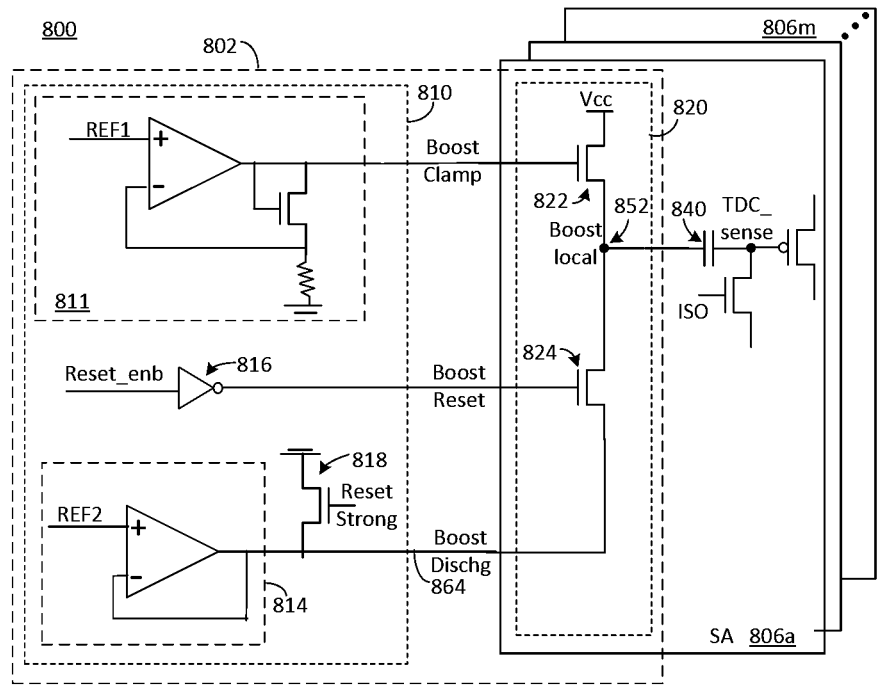
FIGS. 8A and 8B illustrate a third example of the sense circuitry including boost logic of FIG. 4 related to MLC memory cells and an associated timing diagram, respectively.
Figure 8B:
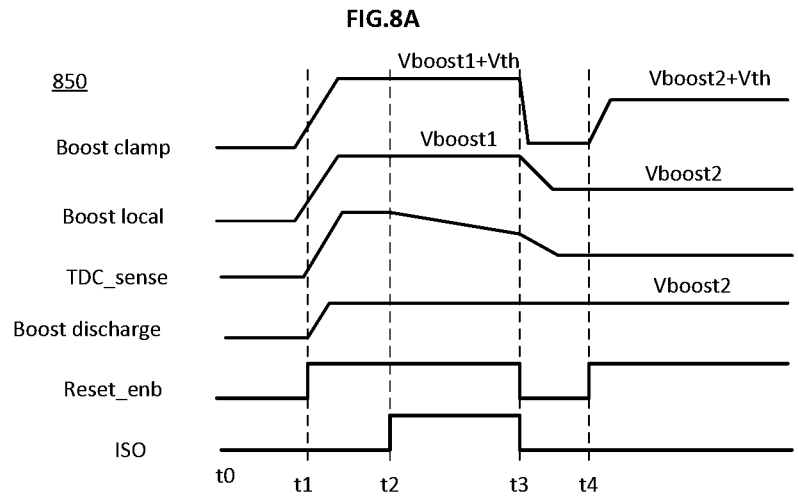

FIGS. 8A and 8B illustrate a third example 800 of the sense circuitry of FIG. 4 related to MLC memory cells and an associated timing diagram 850, respectively. Third example sense circuitry 800 includes boost logic 802 and a plurality of sense amplifiers 806a, . . . , 806m. Boost logic 802 includes a boost source 810 and a plurality of boost interfaces, e.g., boost interface 820. Each boost interface is included in a respective sense amplifier 806a, . . . , 806m. Boost logic 802 includes boost reset logic and boost discharge logic, as described herein. At least a portion of boost reset logic and at least a portion of boost discharge logic may be included in boost source 810 and/or boost interface 820. Boost source 810 includes a boost clamp power supply, e.g., boost voltage source 811. Boost source 810 includes a regulator 814, a source reset transistor 818 and an inverter 816.

Similar to examples 600 and 700 the boost interface 820 includes a buffer, e.g., buffer transistor 822 and a boost reset transistor 824. The boost voltage source 811 and inverter 816 are coupled to buffer 822 and boost reset transistor 824, respectively, similar to the first example 600 and second example 700. The boost voltage source 811 is configured to receive a reference voltage REF1 from, e.g., memory controller logic 110 and/or BL control logic 116. In this example, regulator 814 is configured to receive a reference voltage REF2 related to Vboost2, i.e., a target boost down voltage. Regulator 814 corresponds to a unity gain voltage follower. An output of regulator 814 is coupled to a source of the boost reset transistor 824 via path 864 and is further coupled to a drain of source reset transistor 818. A drain of source reset transistor 818 is coupled to ground. Path 864 from boost reset transistor 824 to source reset transistor 818 then through source reset transistor 818 to ground provides a boost discharge path for boost local node 852. Boost discharge may occur when boost reset transistor 824 is on (e.g., Boost reset is high and Reset_enb is low), source reset transistor is on (e.g., Reset strong is high) and boost local node 852 is greater than the target boost down voltage, e.g., Vboost2. Thus, in this example, boost reset transistor 824 may be operational for both boost reset and boost discharge operations. Thus, in this example, boost discharge logic may include inverter 816, boost reset transistor 824, regulator 814 and possibly source reset transistor 818.

A boost reset operation may be configured to couple boost local node 852 to ground, e.g., to discharge sense capacitor 840. Boost local node 852 may be coupled to ground by boost reset transistor 824 and source reset transistor 818. For example, boost reset transistor 824 may turn on when Reset_enb signal is low (and Boost reset is high). Source reset transistor 818 may turn on when Reset strong signal is high. Thus, in this example, boost reset logic includes inverter 816 and transistors 824 and 818.

Referring to FIG. 8B, during operation, at time t1, Boost clamp voltage, an output of boost voltage source 811, begins to ramp up to Vboost1 plus Vth (i.e., threshold voltage of buffer transistor 822) and boost local node 852 voltage begins to ramp up to Vboost1. Reset_enb signal transitions from low to high, turning off boost reset transistor 824. Boost discharge path 864 begins ramping up to Vboost2. At time t3, Reset_enb signal switches from high to low turning on boost reset transistor 824 and thereby coupling regulator 814 output to boost local node 852 via boost reset transistor 824. At time t4, Reset_enb again switches high. Boost local node 852 voltage transitions relatively quickly from Vboost1 to Vboost2 during the time interval t3 to t4. The final value of boost local node 852 voltage during the interval between t3 and t4 may be determined (i.e., set) by reference signal REF2 that is input to regulator 814.

Thus, in this third embodiment 800, a boost clamp voltage may be supplied to a plurality of boost interfaces included in the plurality of sense amplifiers 806a, . . . , 806m. Buffers, e.g., buffer transistor 822, included in the boost interfaces are configured to prevent data-dependent pull down of the boost clamp voltage. Boost voltage may be controllably discharged to a target voltage, e.g., Vboost2, set by the regulator 814. In this embodiment, the boost interfaces do not include a boost discharge transistor. In this example, boost source transistor 818 is included in boost source 810. Thus, rather than including a respective boost discharge transistor in each boost interface, one boost source transistor may be included in boost source.

Thus, a boost voltage may be supplied to a plurality of sense amplifiers that is configured to increase a sense window. Pull down of the boost voltage may be avoided via a respective buffer for each sense amplifier. Boost discharge may be implemented by providing a discharge path and discharge control signal thereby facilitating sensing on MLCs. Thus, a wait time for boost recovery may be avoided.

Figure 9:
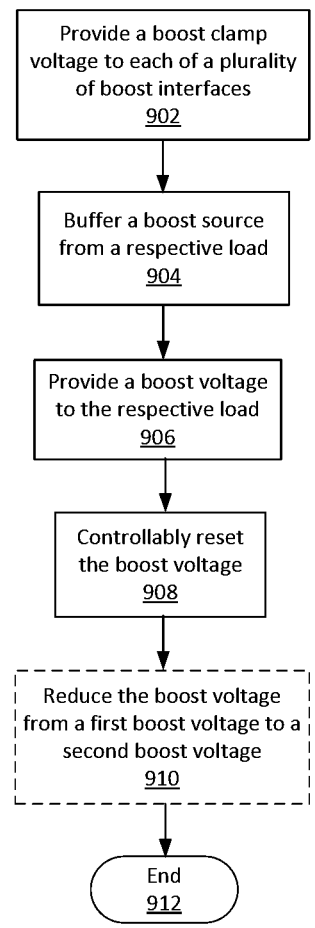
FIG. 9 illustrates a flowchart of operations for increasing a sense window using boost, consistent with various embodiments of the present disclosure.

FIG. 9 illustrates a flowchart 900 of operations for increasing a sense window using a boost voltage, consistent with various embodiments of the present disclosure. The operations may be performed, for example, by a memory controller, e.g., memory controller 104, including memory sense circuitry 118 and/or boost logic, e.g., boost logic 402. Flowchart 900 depicts exemplary operations configured to increase a sense window using boost. In particular, flowchart 900 depicts exemplary operations configured to provide a boost clamp voltage to a boost interface configured buffer a boost source from a load, as described herein.

Operations of flowchart 900 may start at operation 902. Operation 902 includes providing a boost clamp voltage to each of a plurality of boost interfaces. For example, the boost clamp voltage may be provided by a boost source. The boost clamp voltage is configured to increase a sensing window by boosting a sensing voltage. Operation 904 includes buffering the boost source from a respective load. For example, each boost interface may include a buffer. A boost voltage may be provided to the respective load at operation 906. For example, the boost interface may be coupled to a sense capacitor (i.e., load) and may be configured to provide the boost voltage to a boost local node coupled to the sense capacitor. The boost voltage is related to the boost clamp voltage. In some embodiments, the boost voltage may be controllably reset at operation 908. For example, the boost voltage may be reset by coupling the boost local node to ground. In some embodiments, operation 910 may include reducing the boost voltage from a first boost voltage to a second boost voltage. For example, the boost voltage may be reduced to facilitate memory access operations on MLC memory cells. Program flow may end at operation 912.

While FIG. 9 illustrates various operations according one embodiment, it is to be understood that not all of the operations depicted in FIG. 9 are necessary for other embodiments. Indeed, it is fully contemplated herein that in other embodiments of the present disclosure, the operations depicted in FIG. 9 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, an apparatus, system and method configured to increase a sensing window related to accessing a memory cell. The apparatus includes boost logic configured to generate, maintain, adjust and/or discharge a boost voltage. The boost voltage may then be utilized to increase the sensing window. Boost logic includes a boost source and a plurality of boost interfaces. Boost source is configured to generate a boost clamp voltage and to provide the boost clamp voltage to the boost interfaces. Each boost interface is configured to provide a boost voltage related to the boost clamp voltage to a respective load, e.g., sensing element, in each sense amplifier of a memory array. The boost interfaces are configured to buffer the boost source from the load to reduce and/or prevent dependence of boost voltage on load. Buffering is configured to prevent the boost clamp voltage from being pulled down when load current is relatively high.

Boost logic may further include boost reset logic configured to drain stored charge related to the boost voltage. In some embodiments, boost logic may further include boost discharge logic configured to reduce the boost voltage from a first voltage Vboost1 to a second voltage Vboost2.

EXAMPLES

Examples of the present disclosure include subject material such as a method, means for performing acts of the method, a device, or of an apparatus or system related generating, maintaining, adjusting and/or discharging a boost voltage, as discussed below.

Example 1

According to this example there is provided an apparatus including boost logic. The boost logic includes a boost source and a plurality of boost interfaces coupled to the boost source. The boost source is configured to provide a boost clamp voltage to each of the plurality of boost interfaces. Each of the plurality of boost interfaces includes a respective buffer configured to buffer the boost source from a respective load. Each boost interface is configured to provide a boost voltage to the respective load. The boost voltage is configured to increase a sense window. The boost voltage is related to the boost clamp voltage.

Example 2

This example includes the elements of example 1, wherein the boost logic includes boost reset logic configured to controllably reset the boost voltage.

Example 3

This example includes the elements of example 1, wherein the boost logic further includes boost discharge logic configured to reduce the boost voltage from a first boost voltage to a second boost voltage less than the first boost voltage.

Example 4

This example includes the elements of example 1, wherein the buffer includes a buffer transistor configured as a voltage follower.

Example 5

This example includes the elements of example 2, wherein the boost interface includes at least a portion of the boost reset logic, the portion including a transistor configured to controllably couple a boost local node to a ground.

Example 6

This example includes the elements of example 3, wherein the boost source and the boost interface each include a respective portion of the boost discharge logic. The boost source portion includes a current generator and the boost interface includes a transistor configured to mirror current generator current in the boost interface. A discharge rate is related to the mirrored current.

Example 7

This example includes the elements of example 3, wherein the boost interface includes at least a portion of the boost discharge logic, the portion including a boost discharge transistor coupled to an output of the buffer.

Example 8

This example includes the elements of example 3, wherein the boost source includes at least a portion of the boost discharge logic, the boost source portion including a regulator configured to control the second boost voltage.

Example 9

This example includes the elements of any one of examples 1 through 8, wherein a number of boost interfaces is greater than ten thousand.

Example 10

This example includes the elements of example 2, wherein the boost interface includes at least a portion of the boost reset logic, the boost reset logic portion including a boost reset transistor, the boost reset transistor coupled to an output of the buffer.

Example 11

This example includes the elements of example 4, wherein the buffer transistor is an n-type metal oxide semiconductor field effect transistor (NMOS).

Example 12

According to this example there is provided a method including providing, by a boost source, a boost clamp voltage to each of a plurality of boost interfaces. This example further includes buffering, by each boost interface, the boost source from a respective load. This example further includes providing, by each boost interface, a boost voltage to the respective load, the boost voltage configured to increase a sense window, the boost voltage related to the boost clamp voltage.

Example 13

This example includes the elements of example 12, and further includes controllably resetting, by boost reset logic, the boost voltage.

Example 14

This example includes the elements of example 12, and further includes reducing, by boost discharge logic, the boost voltage from a first boost voltage to a second boost voltage less than the first boost voltage.

Example 15

This example includes the elements of example 12, wherein the boost interface includes a buffer including a buffer transistor configured as a voltage follower.

Example 16

This example includes the elements of example 13, wherein the boost interface includes at least a portion of the boost reset logic and further including controllably coupling, by a transistor included in the at least a portion of the boost reset logic, a boost local node to a ground.

Example 17

This example includes the elements of example 14, wherein the boost source and the boost interface each include a respective portion of the boost discharge logic. The boost source portion includes a current generator and the boost interface includes a transistor. This example further includes, generating, by the current generator, a current, and mirroring, by the transistor, the generated current in the boost interface, a discharge rate related to the mirrored current.

Example 18

This example includes the elements of example 14, wherein the boost interface includes at least a portion of the boost discharge logic, the portion including a boost discharge transistor coupled to an output of the buffer.

Example 19

This example includes the elements of example 14, wherein the boost source includes at least a portion of the boost discharge logic, and further including, controlling, by a regulator included in the boost source portion, the second boost voltage.

Example 20

This example includes the elements of example 12, wherein a number of boost interfaces is greater than ten thousand.

Example 21

This example includes the elements of example 13, wherein the boost interface includes at least a portion of the boost reset logic, the boost reset logic portion including a boost reset transistor, the boost reset transistor coupled to an output of the buffer.

Example 22

This example includes the elements of example 15, wherein the buffer transistor is an n-type metal oxide semiconductor field effect transistor (NMOS).

Example 23

According to this example there is provided a system including a processor; a chipset configured to couple the processor to a peripheral device; a memory array including a plurality of memory cells; and a memory controller. The memory controller includes boost logic. The boost logic includes a boost source and a plurality of boost interfaces coupled to the boost source. The boost source is configured to provide a boost clamp voltage to each of the plurality of boost interfaces. Each of the plurality of boost interfaces includes a respective buffer configured to buffer the boost source from a respective load. Each boost interface is configured to provide a boost voltage to the respective load. The boost voltage is configured to increase a sense window. The boost voltage is related to the boost clamp voltage.

Example 24

This example includes the elements of example 23, wherein the boost logic includes boost reset logic configured to controllably reset the boost voltage.

Example 25

This example includes the elements of example 23, wherein the boost logic further includes boost discharge logic configured to reduce the boost voltage from a first boost voltage to a second boost voltage less than the first boost voltage.

Example 26

This example includes the elements of example 23, wherein the buffer includes a buffer transistor configured as a voltage follower.

Example 27

This example includes the elements of example 24, wherein the boost interface includes at least a portion of the boost reset logic, the portion including a transistor configured to controllably couple a boost local node to a ground.

Example 28

This example includes the elements of example 25, wherein the boost source and the boost interface each include a respective portion of the boost discharge logic, the boost source portion including a current generator and the boost interface including a transistor configured to mirror current generator current in the boost interface, a discharge rate related to the mirrored current.

Example 29

This example includes the elements of example 25, wherein the boost interface includes at least a portion of the

19 boost discharge logic, the portion including a boost discharge transistor coupled to an output of the buffer.

Example 30

This example includes the elements of example 25, wherein the boost source includes at least a portion of the boost discharge logic, the boost source portion including a regulator configured to control the second boost voltage.

Example 31

This example includes the elements of any one of examples 23 through 30, wherein a number of boost interfaces is greater than ten thousand.

Example 32

This example includes the elements of example 24, wherein the boost interface includes at least a portion of the boost reset logic, the boost reset logic portion including a boost reset transistor, the boost reset transistor coupled to an output of the buffer.

Example 33

This example includes the elements of example 26, wherein the buffer transistor is an n-type metal oxide semiconductor field effect transistor (NMOS).

Example 34

This example includes the elements of example 23, wherein the memory includes NAND flash memory.

Example 35

This example includes the elements of example 23, wherein each of the plurality of boost interfaces is included in a respective sense amplifier.

Example 36

This example includes the elements of example 23, wherein each load includes a respective sense capacitor controllably coupled to a respective string of memory cells.

Example 37

This example includes the elements of example 23, wherein the memory cells are single level cells.

Example 38

This example includes the elements of example 20 or 21, wherein the memory cells are multiple level cells.

Example 39

Another example of the present disclosure is a system including at least one device arranged to perform the method of any one of claims 12 to 22.

Example 40

Another example of the present disclosure is a device including means to perform the method of any one of claims 12 to 22.

20

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
    boost logic comprising:
        a boost source; and
        a plurality of boost interfaces coupled to the boost source,
        the boost source configured to provide a boost clamp voltage to each of the plurality of boost interfaces, each of the plurality of boost interfaces comprising a respective buffer configured to buffer the boost source from a respective load, each boost interface configured to provide a boost voltage to the respective load, the boost voltage configured to increase a sense window, the boost voltage related to the boost clamp voltage.

2. The apparatus of claim 1, wherein the boost logic comprises boost reset logic configured to controllably reset the boost voltage.

3. The apparatus of claim 1, wherein the boost logic further comprises boost discharge logic configured to reduce the boost voltage from a first boost voltage to a second boost voltage less than the first boost voltage.

4. The apparatus of claim 2, wherein the boost interface comprises at least a portion of the boost reset logic, the portion comprising a transistor configured to controllably couple a boost local node to a ground.

5. The apparatus of claim 3, wherein the boost source and the boost interface each comprise a respective portion of the boost discharge logic, the boost source portion comprising a current generator and the boost interface comprising a transistor configured to mirror current generator current in the boost interface, a discharge rate related to the mirrored current.

6. The apparatus of claim 3, wherein the boost interface comprises at least a portion of the boost discharge logic, the portion comprising a boost discharge transistor coupled to an output of the buffer.

7. The apparatus of claim 3, wherein the boost source comprises at least a portion of the boost discharge logic, the boost source portion comprising a regulator configured to control the second boost voltage.

8. The apparatus of claim 1, wherein a number of boost interfaces is greater than ten thousand.

9. A method comprising:
    providing, by a boost source, a boost clamp voltage to each of a plurality of boost interfaces;
    buffering, by each boost interface, the boost source from a respective load;
    providing, by each boost interface, a boost voltage to the respective load, the boost voltage configured to increase a sense window, the boost voltage related to the boost clamp voltage.

10. The method of claim 9, further comprising:
    controllably resetting, by boost reset logic, the boost voltage.

11. The method of claim 9, further comprising:
    reducing, by boost discharge logic, the boost voltage from a first boost voltage to a second boost voltage less than the first boost voltage.

12. The method of claim 10, wherein the boost interface comprises at least a portion of the boost reset logic and further comprising controllably coupling, by a transistor included in the at least a portion of the boost reset logic, a boost local node to a ground.

13. The method of claim 11, wherein the boost source and the boost interface each comprise a respective portion of the boost discharge logic, the boost source portion comprising a current generator and the boost interface comprising a transistor and further comprising, generating, by the current generator, a current, and mirroring, by the transistor, the generated current in the boost interface, a discharge rate related to the mirrored current.

14. The method of claim 11, wherein the boost interface comprises at least a portion of the boost discharge logic, the portion comprising a boost discharge transistor coupled to an output of the buffer.

15. The method of claim 11, wherein the boost source comprises at least a portion of the boost discharge logic, and further comprising, controlling, by a regulator included in the boost source portion, the second boost voltage.

16. A system comprising:
a processor;
a chipset configured to couple the processor to a peripheral device;
a memory array comprising a plurality of memory cells; and
a memory controller comprising:
  boost logic comprising:
    a boost source; and
    a plurality of boost interfaces coupled to the boost source,
    the boost source configured to provide a boost clamp voltage to each of the plurality of boost interfaces, each of the plurality of boost interfaces comprising a respective buffer configured to buffer the boost source from a respective load, each boost interface configured to provide a boost voltage to the respective load, the boost voltage configured to increase a sense window, the boost voltage related to the boost clamp voltage.

17. The system of claim 16, wherein the boost logic comprises boost reset logic configured to controllably reset the boost voltage.

18. The system of claim 16, wherein the boost logic further comprises boost discharge logic configured to reduce the boost voltage from a first boost voltage to a second boost voltage less than the first boost voltage.

19. The system of claim 17, wherein the boost interface comprises at least a portion of the boost reset logic, the portion comprising a transistor configured to controllably couple a boost local node to a ground.

20. The system of claim 18, wherein the boost source and the boost interface each comprise a respective portion of the boost discharge logic, the boost source portion comprising a current generator and the boost interface comprising a transistor configured to mirror current generator current in the boost interface, a discharge rate related to the mirrored current.

21. The system of claim 18, wherein the boost interface comprises at least a portion of the boost discharge logic, the portion comprising a boost discharge transistor coupled to an output of the buffer.

22. The system of claim 18, wherein the boost source comprises at least a portion of the boost discharge logic, the boost source portion comprising a regulator configured to control the second boost voltage.

23. The system of claim 16, wherein the memory comprises NAND flash memory.

24. The system of claim 16, wherein each of the plurality of boost interfaces is included in a respective sense amplifier.

25. The system of claim 16, wherein each load comprises a respective sense capacitor controllably coupled to a respective string of memory cells.

* * * * *